(12) United States Patent
Heid et al.

(10) Patent No.: US 6,930,482 B2
(45) Date of Patent: Aug. 16, 2005

(54) TIME-VARIABLE MAGNETIC FIELDS GENERATOR FOR A MAGNETIC RESONANCE APPARATUS

(75) Inventors: Oliver Heid, Gunzenhausen (DE); Markus Vester, Nürnberg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/808,959

(22) Filed: Mar. 25, 2004

(65) Prior Publication Data

US 2004/0239327 A1 Dec. 2, 2004

(30) Foreign Application Priority Data

Mar. 25, 2003 (DE) .......................................... 103 13 229
Mar. 11, 2004 (DE) ................................ 10 2004 012 058

(51) Int. Cl.[7] ................................................. G01V 3/00
(52) U.S. Cl. ........................................ 324/318; 324/309
(58) Field of Search ................................ 324/318, 319, 324/322, 311, 309, 307; 600/410

(56) References Cited

U.S. PATENT DOCUMENTS

| 4,680,548 | A |   | 7/1987  | Edelstein et al. |
|-----------|---|---|---------|------------------|
| 4,825,162 | A |   | 4/1989  | Roemer et al.    |
| 4,864,241 | A |   | 9/1989  | Goldie           |
| 5,406,204 | A | * | 4/1995  | Morich et al. ............... 324/318 |
| 5,414,360 | A |   | 5/1995  | Westphal et al.  |
| 5,574,372 | A |   | 11/1996 | Moritz et al.    |
| 5,610,521 | A | * | 3/1997  | Zou et al. .................... 324/318 |
| 6,275,722 | B1 |  | 8/2001  | Martin et al.    |
| 6,531,870 | B2 |  | 3/2003  | Heid et al.      |
| 6,781,378 | B2 | * | 8/2004 | Eberler et al. ............... 324/318 |

FOREIGN PATENT DOCUMENTS

| DE | 34 45 724 | 6/1985 |
| EP | 0 924 530 | 4/2001 |
| GB | 2 396 425 | 6/2004 |

* cited by examiner

*Primary Examiner*—Brij B. Shrivastav
(74) *Attorney, Agent, or Firm*—Schiff Hardin LLP

(57) ABSTRACT

A time-variable magnetic fields generator for a magnetic resonance apparatus has at least one gradient coil with conductors extending essentially in the region of a subject-receiving hollow opening of the magnetic resonance apparatus, and that is free of conductors in a middle axial region of the hollow opening, a first radio-frequency shield that encloses the conductors disposed on the one side of the middle region, a second radio-frequency shield that encloses the conductors disposed on the other side of the middle region, a radio-frequency antenna element that emits a radio-frequency field, disposed between the first and second radio-frequency shield in the middle region, a third radio-frequency shield proceeding radially, externally around the antenna element, such that the radio-frequency shields delimit a field return space within the generator and that is designed for a return of the radio-frequency field.

20 Claims, 6 Drawing Sheets

TIME-VARIABLE MAGNETIC FIELDS GENERATOR FOR A MAGNETIC RESONANCE APPARATUS

BACKGROUND OF THE INVENTION

1. Field of the Invention

The invention concerns a generator of time-variable magnetic fields for a magnetic resonance device with at least one gradient coil, with conductors of the gradient coil extending substantially in the region of a hollow cylinder, and with the gradient coil being free of conductors in a middle region along the axial extent of the hollow cylinder, and a magnetic resonance device with such a generator.

2. Description of the Prior Art

Magnetic resonance technology is a known modality to, among other things, acquire images of the inside of a body of an examination subject. In a magnetic resonance device, rapidly switched gradient fields are generated by a gradient coil system and are superimposed on a static basic magnetic field that is generated by a basic field magnet. Furthermore, the magnetic resonance device has a radio-frequency system that radiates radio-frequency signals into the examination subject to excite magnetic resonance signals and acquires the excited magnetic resonance signals, on the basis of which magnetic resonance images are generated.

To generate gradient fields, appropriate currents are set in gradient coils of the gradient coil system. The amplitudes of the required currents are up to more than 100 A. The current rise and fall rates are up to more than 100 kA/s. Since the gradient coil system normally is surrounded by electrically conductive structures, eddy currents are induced in these by the switched gradient fields. Examples for such conductive structures are the vacuum vessel and/or the cryoshield of a superconducting basic field magnet. The fields arising as a consequence of the eddy currents are undesirable because, without counter measures, they weaken the gradient fields and distort them with regard to their time curve, which leads to impairment of the quality of magnetic resonance images.

The distortion of a gradient field as a result of the eddy current fields can be compensated up to a certain degree by a corresponding pre-distortion of a quantity used for controlling the gradient field. The eddy currents induced on a predetermined enveloping surface (that, for example, runs through an inner cylinder jacket of an 80-K cryoshield of the superconducting basic field magnet) by the gradient coils being fed with current also can be reduced by the use of an actively shielded gradient coil system. A gradient shielding coil associated with the gradient coil normally has a lower number of windings than the gradient coil, and is connected with the gradient coil such that the same current that flows through the gradient coil flows through the gradient shielding coil, but in the opposite direction. The gradient shielding coil thereby has a weakening effect on the gradient field in the imaging volume.

Furthermore it is known from German OS 3445724 to minimize magnetic coupling between an RF coil and a gradient field coil, for example by arranging shielding layers on both sides of the gradient field coil.

A magnetic resonance device is known from German OS 44 14 371 in which a radio-frequency shield is arranged between the radio-frequency antenna and the gradient coil system of the magnetic resonance device, the radio-frequency shield being permeable for the electromagnetic fields generated by the gradient coil system in the low-frequency range and impermeable for the fields generated by the radio-frequency antenna in the radio-frequency range. The radio-frequency shield has a first electrically conductive layer arrangement and a second electrically conductive layer arrangement arranged oppositely thereto that are separated from one another by a dielectric. The layer arrangements have adjacently arranged conductor tracks that are separated from one another by electrically insulted grooves; the grooves being offset in the first layer arrangement compared with the second; and in at least one of the layer arrangements, adjacent conductor tracks are connected with one another via specially arranged bridges, for example formed by capacitors, that conduct high-frequency currents.

The radio-frequency antenna of the magnetic resonance device may be fashioned as a so-called birdcage antenna. A birdcage antenna normally is fashioned to generate a homogenous radio-frequency field within a volume enclosed by it, with conductors that are parallel to one another and equally separated being connected with one another via ferrules and defining a cylindrical surface. Tuning is accomplished in the high-pass and low-pass filter ranges by capacitors in each of the conductors, or in the ferrules between the conductors, such that a homogenous radio-frequency field results upon resonance. Embodiments of such a birdcage antenna are found, for example, disclosed in U.S. Pat. No. 4,680,548. The radio-frequency antenna also can be fashioned as an array antenna. The array antenna is characterized by a number of essentially uniform, mutually overlapping conductor loops. Embodiments of such an array antenna are disclosed, for example, in U.S. Pat. No. 4,825,162.

A magnetic resonance device with a gradient coil system is known from German OS 101 56 770, in which an electrically-conductive structure is arranged and fashioned such that, at least within an imaging volume of the magnetic resonance device, a magnetic field of the structure caused by a gradient field via induction effects is similar to the gradient field. In an embodiment, at least one part of the structure is fashioned barrel-shaped as a component of a basic field magnet. Among other things, the gradient coil system can be fashioned without gradient shielding coils, since the undesirable results of the switched gradient fields (due to the similarity of the magnetic field caused by the structure) can be almost completely controlled by a pre-distortion, such that no weakening of the gradient fields occurs due to the gradient shielding coils.

An MR device is known from German OS 4230145 that has a basic field magnet that enables a transverse access to the measurement volume. The MR device has a gradient coil system with axially separated segments. To generate an essentially homogenous RF field in the measurement volume, an axial RF coil system is used that can be introduced into an axial bore of a supporting body or transversally into the recess of the basic field magnet. The MR device or, respectively, its components (such as the basic field magnet, gradient coil system and RF coil system) are fashioned to achieve an optimally large access to the measurement volume for simple implementation of therapy measures such as microsurgical operations, etc.

An MR device is known from U.S. Pat. No. 4,864,241 in which eddy currents are compensated. This ensues by the use of two-part gradient coils that typically form a hollow-cylindrical unit. For RF field generation, a likewise hollow-cylindrically fashioned RF antenna with smaller radius is introduced into the gradient coil unit. Such a design has the disadvantages that it requires a significant amount of space, and that the examination volume of the MR device is determined by the diameter of the RF antenna.

SUMMARY OF THE INVENTION

An object of the present invention is to provide a generator of time-variable magnetic fields of a magnetic resonance device, and a magnetic resonance device with such a generator, in which a device volume that surrounds a predetermined space for exposure of an examination subject can be kept to optimally small dimensions.

This object is achieved in accordance with the invention by a time-variable magnetic fields generator for a magnetic resonance device having at least one gradient coil with conductors extending essentially in the region of a subject-receiving hollow opening of a magnetic resonance apparatus and that is fashioned free of conductors in a middle axial region of the hollow opening, a first radio-frequency shield that encloses the conductors disposed at one side of the middle region, a second radio-frequency shield that encloses the conductors disposed at the other side of the middle region, a radio-frequency antenna element that emits a radio-frequency field and that is disposed between the first and second radio-frequency shield in the middle region, and a third radio-frequency shield that proceeds radially, externally around the antenna element, such that the radio-frequency shields confine a field return space that is within the generator and that is fashioned for return or reverse propagation of the radio-frequency field.

Due to the inventive design of the generator, a region (not provided in conventional solutions) for return of the radio-frequency field (generated by the radio-frequency antenna element) is provided as a field return space within the gradient coil system having the gradient coil. In contrast to the comparable conventional solutions, the structural combination of the gradient coil system and the radio-frequency antenna can be designed with a smaller external diameter, given a consistent internal diameter, or with a larger internal diameter given a consistent external diameter. In the first case, the basic field magnet of the magnetic resonance device can be dimensioned smaller and thus substantially less costly. In the second case, given an unchanged basic field magnet a larger examination subject acceptance space is achieved that, among other things, increases the patient comfort. These advantages of the invention result, among other things, from the arrangement of the RF antenna element in the middle region, meaning between the first and second RF shields, and thus the space occupied by the gradient coil is optimally (doubly) used.

A further advantage of the use of a field return space integrated (preferably sealed) in the generator is that the RF field, at least in this region, is uninfluenced by external activities. This allows the RF field to be monitored and, using the monitoring result, more precisely generated. The third RF shield preferably is disposed not only in the region of the antenna element, and thus in the region of the strongest RF field, but also extends on both sides in the axial direction in regions that are radially disposed outside of the gradient coils surrounded by the RF shields.

In an advantageous embodiment of the generator, the radio-frequency antenna element connects the first and second radio-frequency shields in terms of radio-frequency, such that the first and the second radio-frequency shields, together with the radio-frequency antenna element, form a radio-frequency antenna. This has the advantage that substantial conductor sections of the RF antenna can be formed by conductors (the RF shields) that are anyway present for the gradient coil shielding. This leads to a more compact design of the generator due to the high degree of structural integration of the components used, especially the double use of the RF shields. The connection in terms of radio-frequency can be galvanic or non-galvanic, since in both cases the currents generating the RF field propagate essentially identically in the RF shields. The antenna element typically has a feed-in for an RF signal for RF field generation and/or a read-out for a received MR signal.

In a further advantageous embodiment, the first and second radio-frequency shields are each connected to the third radio-frequency shield via a connection likewise functioning as a radio-frequency shield, such that the field return space is shielded from radio-frequency up to the middle region. This has the advantage that, in the axial direction, electrical conductors can be displaced lateral to the field return space that also (without further measures vis-à-vis the RF field) do not interact with the RF field. Thus, for example, the gradient coil and a shielding coil associated with it can be connected in series without an inductance in the electrically connected conductors. In special embodiments, the radio-frequency connection of the RF shields can be effected by, for example, the first and/or second RF shield being arranged at least in a region near to the third RF shield, or by the first and/or second RF shield being galvanically connected with the third RF shield via a further RF shield.

DESCRIPTION OF THE PREFERRED EMBODIMENTS

Figure 1:
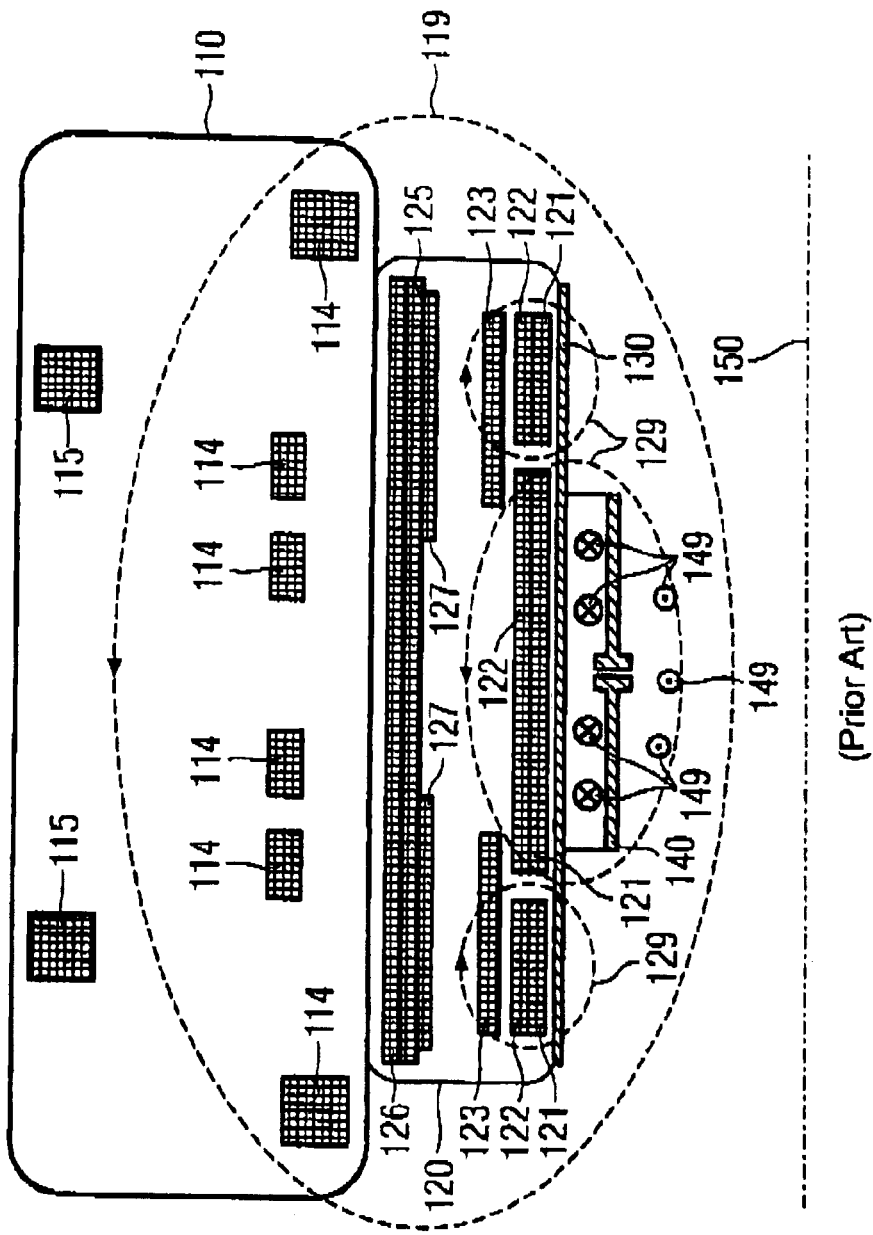
FIG. 1 is a longitudinal section through a magnetic resonance device with a tunnel-like patient acceptance chamber according to the prior art.

FIG. 1 shows a longitudinal section through an upper half of a magnetic resonance device with a tunnel-shaped patient acceptance chamber according to the prior art, wherein for clarity only the components in the sectional plane are shown. The magnetic resonance device has an essentially hollow-cylindrical basic field magnet 110 that, to generate an optimally homogenous static basic magnetic field in the patient acceptance chamber, has superconducting primary coils 114 and likewise superconducting shielding coils 115 associated with the primary coils 114.

A likewise essentially hollow-cylindrical gradient coil system 120 to generate rapidly switchable gradient fields is arranged in the cavity of the basic field magnet 110. The gradient coil system 120 includes, diagnosed from the inside out, the following elements that are concentric to one another in essentially hollow-cylindrical sub-regions of the gradient coil system 120: a first transverse gradient coil 121, formed by four saddle coils to generate a first transverse gradient field with a gradient in a direction perpendicular to the hollow-cylinder main axis 150; a second transverse gradient coil 122, likewise formed by four saddle coils to generate a second transverse gradient field with a gradient in a direction perpendicular to that of the first transverse gradient coil 121 and perpendicular to the hollow-cylinder main axis 150; a cooling device (not shown) to cool the gradient coils 121, 122 and 123; a longitudinal gradient coil 123 formed by two solenoid coils to generate a longitudinal gradient field with a gradient in the direction of the hollow-cylinder main axis 150; a further cooling device in connection with a shim device that are not shown; a longitudinal gradient shielding coil 127 associated with the longitudinal gradient coil 123; a first transverse gradient shielding coil 125 associated with the first transverse gradient coil 121, and a second transverse gradient shielding coil 126 associated with the second transverse gradient coil 122.

Since the conductor structures of the gradient coil system 120 are comparatively large and significantly lossy for many wavelengths in the radio-frequency range, an essentially hollow-cylindrical radio-frequency shield 130 is disposed between the gradient coil system 120 and a radio-frequency antenna 140. This radio-frequency shield is fashioned such that passes the gradient fields generated by the gradient coil system 120 in a low-frequency range and is impermeable for the signals generated by the radio-frequency antenna 140 in the high-frequency (radio-frequency) range.

The radio-frequency antenna 140 is disposed in the cavity of the radio-frequency shield 130 formed as a birdcage antenna in the illustration. A radio-frequency field can be generated in the patient acceptance chamber with the radio-frequency antenna 140, with exemplary field lines 149 of the radio-frequency field being indicated in the region of the patient acceptance chamber with the symbol ⊙. The symbol ⊙ thereby identifies a numbered field line 149 exiting from the drawing plane at this location. The actual radio-frequency antenna 140 is separated, for example, by approximately 3 cm from the radio-frequency shield 130. Compared to a predetermined size of the patient acceptance chamber for a basic field magnet not taking into account the 3 cm, these 3 cm represent a dimensional enlargement of approximately 10% that has significant costs. This separation enables a flux return of the radio-frequency field generated by the radio-frequency antenna 140, thus a closing of the field lines 149, with the field lines being indicated with the symbol ⊗ in the region between the radio-frequency antenna 140 and the radio-frequency shield 130. The symbol ⊗ identifies a numbered field line 149 entering the drawing plane at this location. The width of this space provided for the flux return cannot be selected too small, since otherwise the counter-propagating portions of the field lines 149 would lie very close to one another, and an unacceptably large portion of the field energy would be located in the return, and the filling factor and the efficiency of the radio-frequency antenna 150 would be significantly decreased.

Furthermore, a field line 119 of the basic magnetic field is shown as an example in FIG. 1 that encloses the region of the basic field magnet 110, and exemplary field lines 129 of the second transverse gradient field are shown that enclose the region of the gradient coil system 120. All magnetic fields that are applied in the patient acceptance chamber must close outside of the patient acceptance chamber.

Figure 2:
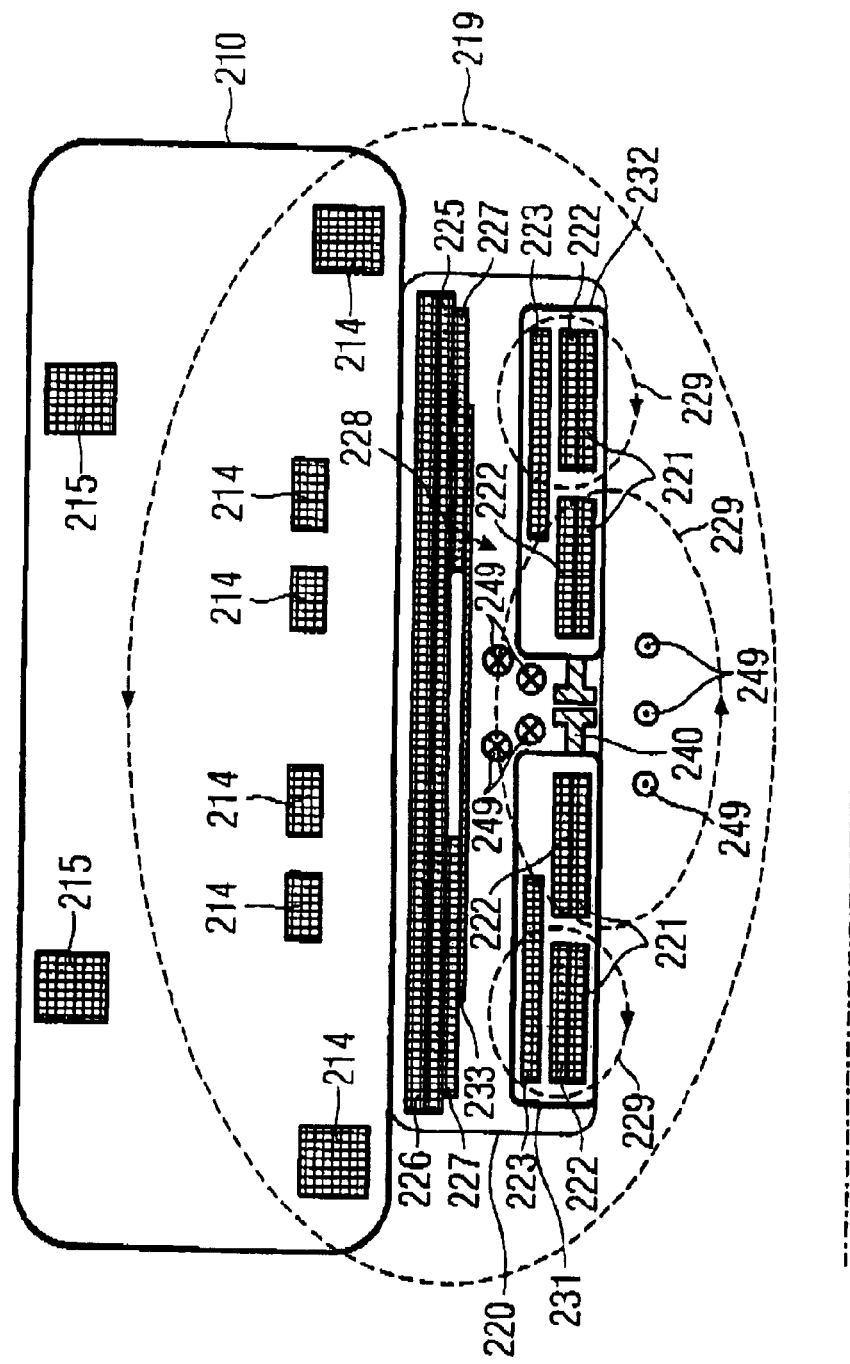
FIG. 2 is a longitudinal section through a magnetic resonance device with a tunnel-like patient acceptance chamber and with an actively shielded gradient coil system with an integrated radio-frequency antenna in accordance with the invention.

FIG. 2 shows, as an exemplary embodiment of the invention, a longitudinal section through an upper half of a magnetic resonance device with a substantially tunnel-like patient acceptance chamber, wherein for clarity again only the components in the section plane are shown.

To generate an optimally homogenous static basic magnetic field in the patient acceptance chamber, the magnetic resonance device has a basic field magnet 210 with superconducting primary coils 214 and likewise superconducting shielding coils 215 associated with the primary coils 214.

Furthermore, to generate rapidly switchable gradient fields, the magnetic resonance device has an essentially hollow-cylindrical gradient coil system 220 with a first transverse gradient coil 221, a second transverse gradient coil 222, a longitudinal gradient coil 223, and gradient shielding coils 225, 226 and 227 associated with the gradient coils 221, 222 and 223. The conductor arrangements of the gradient coils 221, 222 and 223 are designed such that a middle region of the gradient coil system 220 is free of conductors of the gradient coils 221, 222 and 223, in which is arranged a radio-frequency antenna element 240 of the magnetic resonance device. The conductors of the gradient coils 221, 222 and 223 arranged on both sides of the middle region are surrounded by thin metallic radio-frequency shields 231 and 232. The RF antenna element 240 can either form an RF antenna by itself, or it can be part of an RF antenna together with both RF shields 231 and 232. In addition, the RF antenna element 140 and the RF shields 231 and 232 connected with one another in terms of radio-frequency.

The longitudinal gradient primary coil 223 formed by two coils fashioned substantially like solenoids exhibits, from the housing outward, a minimum with regard to its current density in the aforementioned middle region, such that its free-of-conductors design is unproblematic in this middle region. The essentially transverse gradient coils 221 and 22 formed by four saddle coils generally carry a current in the circumferential direction in this middle region. Particularly, in the case of transverse gradient coils with comparatively slight longitudinal extent, it is necessary for realization of optimally linear gradient fields to disperse the current in the middle region such that a minimum or even a weakly developed reverse current density results. In the illustrated design this can explicitly be set to zero such that a middle region free of conductors is obtained. Given a longitudinal extent of the gradient coil system 220 by approximately less than one and a half times its diameter, the middle region can exhibit, for example, a longitudinal extent of 12 cm.

The conductors of the gradient coils 221, 222 and 223 arranged on both sides of the middle region are, as stated, surrounded by the metallic radio-frequency shields 231 and 232, respectively. The radio-frequency shields 231 and 232 can carry a high-frequency current and omit the conductor-free middle region. Both radio-frequency shields 231 and 232 are provided in a known manner with capacitively bridged gaps in order to keep the eddy currents induced in the radio-frequency shield 231 and 232 by the time-variable gradient fields small.

The short radio-frequency antenna element 240 arranged in the middle region lies on a cylinder radius that is not smaller than the inner radius of the gradient coil system 220.

In contrast to the conventional solutions, the radio-frequency antenna formed by the RF antenna element 240 takes away no space within the patient acceptance chamber. The field lines 249 of the radio-frequency field that can be generated with the radio-frequency antenna close within the gradient coil system 220 in a field return space 228 outside of the gradient coils 221, 222 and 223. A return of the gradient fields 229 also ensues in the fields return space 228. Thus at least parts of the gradient coil system 220 are used for the return of the radio-frequency field. The radio-frequency shields 231 and 232 can form a part of the current path of the radio-frequency antenna 240. An external restriction of the return of the radio-frequency field first ensues on the radio-frequency shield 223 associated with the gradient shielding coils 225, 226 and 227. The RF shield 233 thus extends radially outside of the antenna element 240. The RF field is strongest in this region. In order to more clearly delimit the field return space 233, the RF shield 233 preferably is elongated on both sides in the axial direction, such that it extends in regions disposed radially outwardly of the gradient coils 221, 222, 223. The symbols and U used to represent the field lines are explained in FIG. 1. That which is specified in FIG. 1 for the field lines 119 and 129 is valid for the field lines 219 of the basic magnetic field and the field lines 229 of the second transversal gradient field of FIG. 2.

Figure 3:
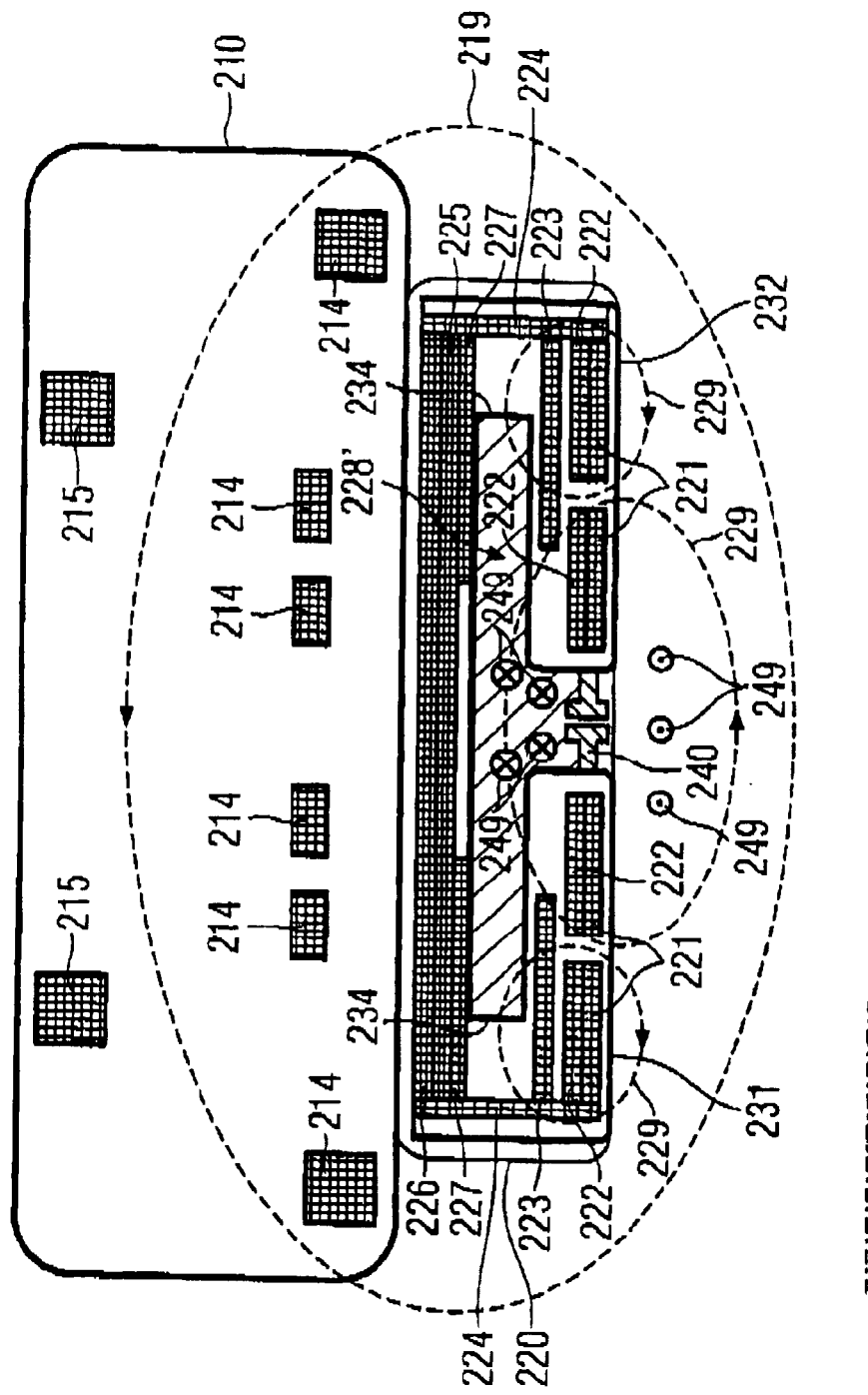
FIG. 3 shows a magnetic resonance device corresponding to FIG. 2, with a field return space shielded on all sides from radio-frequency, with the exception of the middle region in accordance with the invention.

FIG. 3 shows a magnetic resonance device with the components of the MR device from FIG. 2, wherein a field return space 229' is additionally shielded from radio-frequency in the axial direction. This ensues by RF shielding side walls 234 that connect both ends of the RF shield 233 with the RF shields 231, 232. The field return space 228' is shielded from radio-frequency up to the middle region, i.e. it is surrounded with RF shields up to the middle region. This has the advantage that primary gradient coils 221, 222, 223 can be connected in series with the corresponding shielding coils 225, 226, 227 without creating interactions of the RF field with the connecting electrical conductors 224. The expansion of the field return space 228' in the axial direction can be optimized dependent on the efficiency of the RF antenna, taking into account that a too-high magnetic field energy in the field return space 228' that is too large can have a disadvantageous effect on the efficiency.

Figure 4:
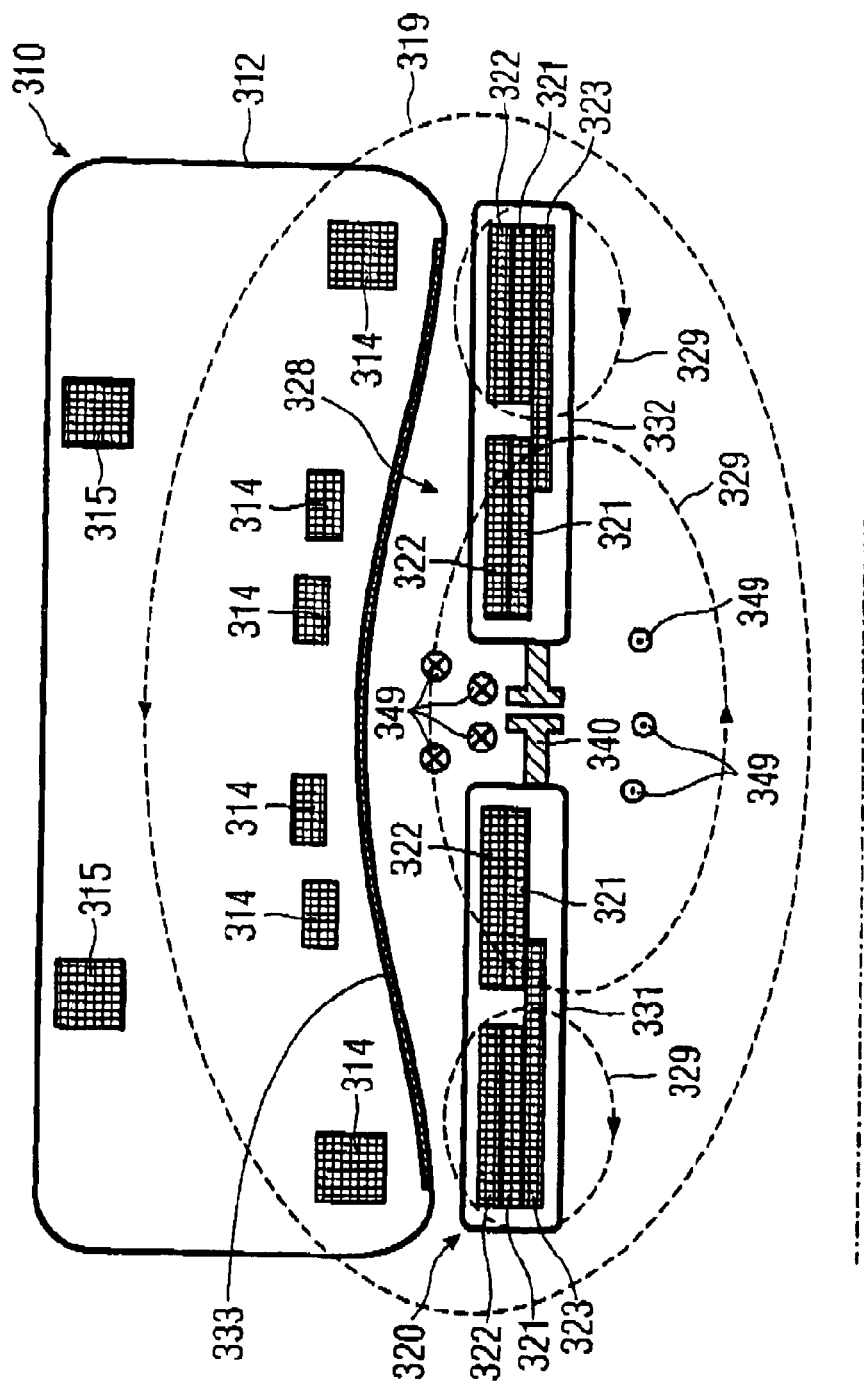
FIG. 4 is a longitudinal section through a magnetic resonance device with a tunnel-like patient acceptance chamber, with a basic field magnet with a barrel-shaped cavity, and with a non-actively shielded gradient coil system formed by two halves, between which a radio-frequency antenna is arranged in accordance with the invention.

As a further exemplary embodiment of the invention, FIG. 4 shows a longitudinal section through an upper half of a magnetic resonance device with an essentially tunnel-like patient acceptance chamber, wherein for clarity again only the components in the section plane are shown. The magnetic resonance device has a substantially hollow-cylindrical basic field magnet 310 with superconducting primary and shielding coils 314 and 315, with a barrel-shaped electrically-conductive vacuum vessel 312 of the basic field magnet 310 in the region of the cavity to convert [implement] the concept of the previously mentioned in German OS 101 56 770.

A gradient coil system 320 formed by two hollow-cylindrical halves separated from one another is arranged in the cavity. The gradient coil system 320 includes, from the inside out, a longitudinal gradient coil 3232, a first transverse gradient coil 321, and a second transverse gradient coil 322. The sub-coils of the gradient coils 321, 322 and 323 are, in each half, completely enclosed by the radio-frequency shields 331 and 332. Analogous to FIG. 2 or 3, a radio-frequency antenna element 340 is attached between the halves of the gradient coil system 320. A sufficiently large field return space 328 thus is available between the gradient coil system 320 and the vacuum vessel 312 to close the field lines 349 of the radio-frequency field that is generated with the radio-frequency antenna formed by the radio-frequency antenna element 340. The vacuum vessel 312 either is fashioned as an RF shield 333 on the side associated with the field return space 328, or such an RF shield 333 is attached to it. The RF shield preferably extends over the barrel-shaped bulge in order to optimally shield the basic field magnet 310. The description for the field lines 119 and 129 in FIG. 1 is valid for the field lines 319 of the basic magnetic field and the field lines 329 of the second transversal gradient field of FIG. 4.

Figure 5:
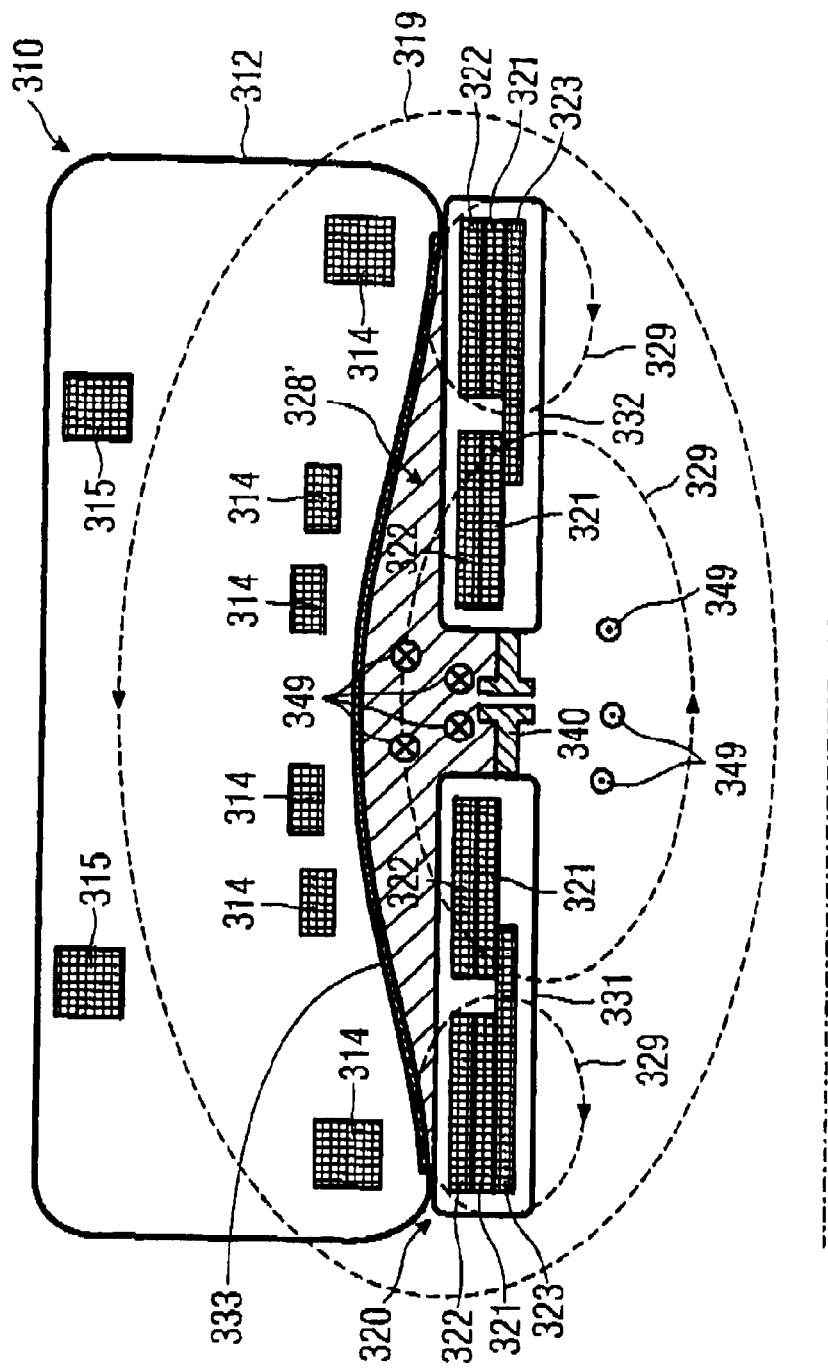
FIG. 5 shows a magnetic resonance device corresponding to FIG. 4, wherein RF shields that surround the gradient coils and an RF shield situated radially outside the gradient coils are spatially adjacent to one another in regions at the edge in the axial direction, such that, with the exception of the middle region, a field return space shielded from radio-frequency is present in accordance with the invention.

FIG. 5 shows a magnetic resonance device with the components of the MR device from FIG. 4, wherein the gradient system 320 and the barrel-shaped basic field magnet system 310 lie so close to one another that the radio-frequency shield 333 and the first and second radio-frequency shields 331 and 332 are connected with one another in terms of radio-frequency. A field return space 328' shielded from radio-frequency up to the middle region thereby is achieved.

Figure 6:
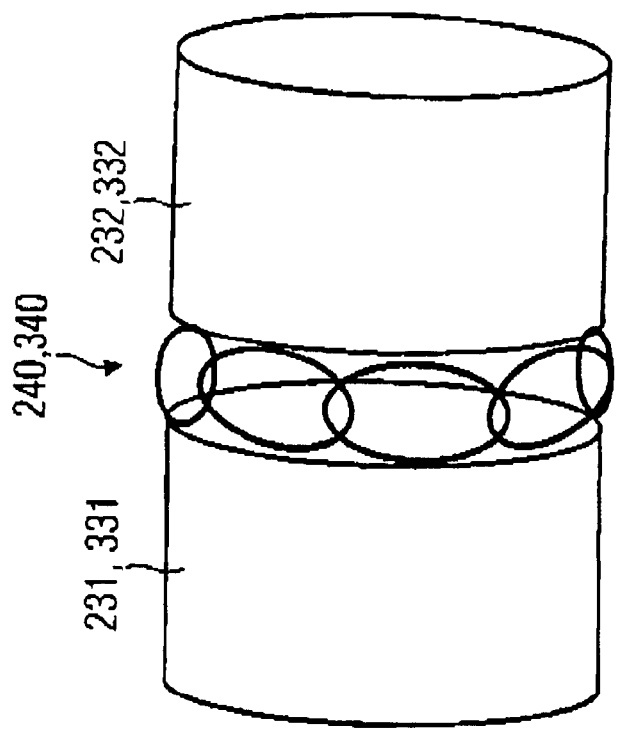
FIG. 6 shows the radio-frequency antenna of FIGS. 2 through 5 formed as a birdcage antenna.
Figure 7:
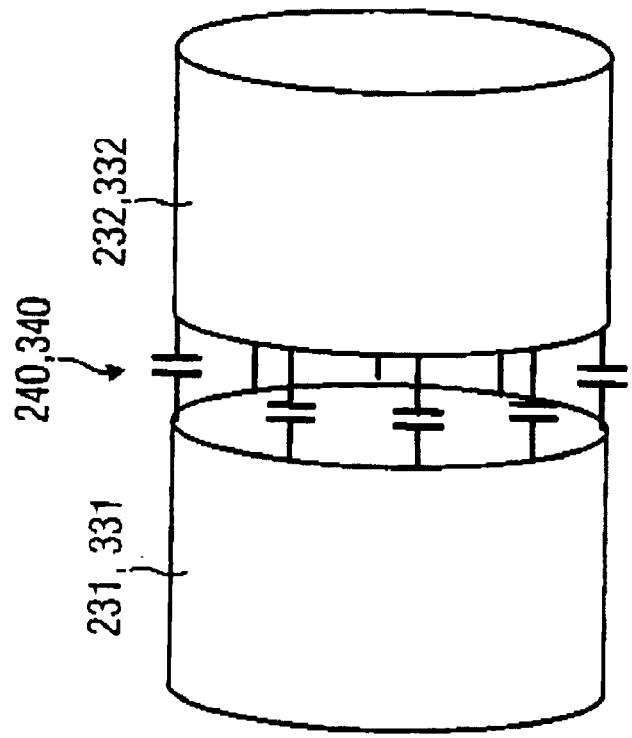
FIG. 7 shows the radio-frequency antenna of FIGS. 2 through 5 formed as an array antenna.

As a further exemplary embodiment of the invention, FIG. 6 shows in a perspective view a radio-frequency antenna 240 or 340 formed as a birdcage antenna disposed between the radio-frequency shields 231 and 232 or 331 and 332. FIG. 7 shows, in a perspective view as a further exemplary embodiment of the invention, a radio-frequency antenna 240 or 340 formed as an array antenna disposed between the radio-frequency shields 231 and 232 or 331 and 332.

Although modifications and changes may be suggested by those skilled in the art, it is the intention of the inventors to embody within the patent warranted hereon all changes and modifications as reasonably and properly come within the scope of their contribution to the art.

What is claimed is:

1. A time-variable magnetic fields generator for a magnetic resonance apparatus comprising:
   a gradient coil formed by conductors adapted to be disposed at a subject-receiving, hollow opening of a magnetic resonance apparatus, said hollow opening having an axial extent and said gradient coil being free of said conductors at an axial middle region of said hollow opening;
   a radio-frequency antenna element for emitting a radio-frequency field, adapted to be disposed in said middle region;
   a first radio-frequency shield enclosing said conductors at a first side of said middle region;
   a second radio-frequency shield enclosing said conductors at a second, opposite side of said middle region;
   a third radio-frequency shield proceeding radially around an exterior of said radio-frequency antenna element; and
   said first, second and third radio-frequency shields delimiting a field return space for return of said radio-frequency field.

2. A generator as claimed in claim 1 wherein said gradient coil is adapted to be disposed at a subject-receiving hollow opening wherein said middle region is cylindrical.

3. A generator as claimed in claim 2 wherein said radio-frequency antenna element is adapted to extend into said hollow opening.

4. A generator as claimed in claim 1 wherein said gradient coil is adapted to be disposed at a subject-receiving hollow opening wherein said middle region is barrel-shaped.

5. A generator as claimed in claim 1 wherein said radio-frequency antenna element connects said first and second radio-frequency shields together in terms of radio-frequency, and wherein said first and second radio-frequency shields in combination with said radio-frequency antenna element form a radio-frequency antenna.

6. A generator as claimed in claim 5 wherein said first and second radio-frequency shields and said radio-frequency antenna elements form a birdcage antenna, as said radio-frequency antenna.

7. A generator as claimed in claim 5 wherein said first and second radio-frequency shields and said radio-frequency antenna elements form an array antenna, as said radio-frequency antenna.

8. A generator as claimed in claim 1 comprising a connection connecting each of said first and second radio-frequency shields with said third radio-frequency shield, said connection also forming a radio-frequency shield, for causing said first, second and third radio-frequency shields and said connection to shield said return space from radio-frequency up to said middle region.

9. A generator as claimed in claim 1 wherein said first, second and third radio-frequency shields in combination with said radio-frequency antenna element form a radio-frequency antenna in which said third radio-frequency shield is a return conductor.

10. A generator as claimed in claim 1 wherein said gradient coil generates a gradient field, and wherein at least one of said first, second and third radio-frequency shields is permeable for said gradient field and is substantially impermeable for said radio-frequency field.

11. A generator as claimed in claim 1 comprising a gradient shielding coil associated with said gradient coil.

12. A generator as claimed in claim 11 wherein said gradient shielding coil is outwardly radially spaced from said gradient coil, and wherein said third radio-frequency shield is disposed between said gradient shielding coil and said gradient coil.

13. A generator as claimed in claim 12 wherein said gradient coil, said first and second radio-frequency shields and said radio-frequency antenna element comprise a unitary structural component.

14. A generator as claimed in claim 1 wherein said gradient coil system is comprised of two halves, and wherein said radio-frequency antenna element is disposed between said two halves.

15. A magnetic resonance apparatus comprising:

a housing containing a hollow opening adapted to receive an examination subject therein, at least partially surrounded by a basic field magnet for generating a basic magnetic field in an imaging volume within said hollow opening; and a time-variable magnetic fields generator comprising a gradient coil formed by conductors adapted to be disposed at said hollow opening of a magnetic resonance apparatus, said hollow opening having an axial extent and said gradient coil being free of said conductors at an axial middle region of said hollow opening, a radio-frequency antenna element for emitting a radio-frequency field, adapted to be disposed in said middle region, a first radio-frequency shield enclosing said conductors at a first side of said middle region, a second radio-frequency shield enclosing said conductors at a second, opposite side of said middle region, a third radio-frequency shield proceeding radially around an exterior of said radio-frequency antenna element, and said first, second and third radio-frequency shields delimiting a field return space for return of said radio-frequency field.

16. A magnetic resonance apparatus as claimed in claim 15 wherein said conductors of said gradient coil are adapted to carry a time-varying current for generating a gradient field and wherein said housing contains elements that interact with said gradient field and generate an eddy current, with an associated eddy current field, said eddy current field causing said gradient field to have a non-linear portion in said imaging volume, and wherein said magnetic resonance apparatus comprises an electrically conductive structure in said housing at least partially surrounding said gradient coil for, triggered by a change in said current carried by said conductors of said gradient coil, generates a compensating eddy current field in said imaging volume for compensating said non-linear portion.

17. A magnetic resonance apparatus as claimed in claim 16 wherein said gradient coil and said electrically conductive structure are tuned to each other for causing said electrically conductive structure to generate a compensating eddy current field that is geometrically similar to said gradient field.

18. A magnetic resonance apparatus as claimed in claim 16 wherein said electrically conductive structure is a portion of said basic field magnet.

19. A magnetic resonance apparatus as claimed in claim 18 wherein said basic field magnet comprises a vacuum vessel, and wherein said vacuum vessel is said electrically conductive structure.

20. A magnetic resonance apparatus as claimed in claim 16 wherein said electrically conductive structure is barrel-shaped.

* * * * *